(12) United States Patent
Sashi et al.

(10) Patent No.: US 9,234,680 B2
(45) Date of Patent: Jan. 12, 2016

(54) SOLAR LIGHT REFLECTING PLATE AND LIGHT COLLECTING/HEAT COLLECTING DEVICE

(75) Inventors: Kazumichi Sashi, Tokyo (JP); Takahiko Oshige, Tokyo (JP); Naoki Nishiyama, Tokyo (JP); Yoshihito Sakamoto, Tokyo (JP)

(73) Assignee: JFE Steel Corporation (JP)

( * ) Notice: Subject to any disclaimer, the term of this patent is extended or adjusted under 35 U.S.C. 154(b) by 0 days.

(21) Appl. No.: 14/238,319

(22) PCT Filed: Aug. 9, 2012

(86) PCT No.: PCT/JP2012/070333
§ 371 (c)(1),
(2), (4) Date: Feb. 11, 2014

(87) PCT Pub. No.: WO2013/031513
PCT Pub. Date: Mar. 7, 2013

(65) Prior Publication Data
US 2014/0209091 A1    Jul. 31, 2014

(30) Foreign Application Priority Data

Aug. 26, 2011  (JP) ................................ 2011-184502

(51) Int. Cl.
*F24J 2/12* (2006.01)
*F24J 2/14* (2006.01)
(Continued)

(52) U.S. Cl.
CPC ................ *F24J 2/12* (2013.01); *C23C 14/025* (2013.01); *C23C 14/028* (2013.01);
(Continued)

(58) Field of Classification Search
CPC .................. F24J 2/10; F24J 2/14; G02B 5/08
USPC .......... 126/694, 634, 635, 657, 696; 136/258, 136/259, 260; 359/838, 853
See application file for complete search history.

(56) References Cited

U.S. PATENT DOCUMENTS

| | | | | |
|---|---|---|---|---|
| 4,235,951 A | * | 11/1980 | Swarovski | ........ B32B 17/10174 428/202 |
| 5,986,205 A | * | 11/1999 | Matsune et al. | ............... 136/258 |
| 6,322,872 B1 | | 11/2001 | Fuchs | |
| 2003/0081333 A1 | | 5/2003 | Winston | |
| 2010/0053785 A1 | * | 3/2010 | Nishi et al. | ..................... 359/838 |
| 2012/0325201 A1 | * | 12/2012 | Deng | ......................... F24J 2/07 126/694 |

FOREIGN PATENT DOCUMENTS

JP  57-004003    1/1982
JP  60-263054   12/1985
(Continued)

OTHER PUBLICATIONS

Supplementary European Search Report dated Oct. 7, 2014 from corresponding European Patent Application No. 12 82 7770.

*Primary Examiner* — Gregory Huson
*Assistant Examiner* — Nikhil Mashruwala
(74) *Attorney, Agent, or Firm* — DLA Piper LLP (US)

(57) ABSTRACT

A solar light reflecting plate used for a light condensing and heat collecting device which includes a solar light reflecting plate that reflects and condenses solar light and a heat collecting tube that receives the solar light condensed by the solar light reflecting plate and is heated by the condensed solar light, wherein the solar light reflecting plate includes at least a rolled substrate, a surface roughness of a solar light reflecting surface that is an outermost surface and that reflects solar light is 0.02 μm to 1.0 μm in terms of arithmetic mean roughness Ra, and the solar light reflecting plate is disposed so that an angle between a rolling direction of the substrate and a longitudinal direction of the heat collecting tube is 80° to 100°.

9 Claims, 3 Drawing Sheets

(51) Int. Cl.
  *G02B 7/183* (2006.01)
  *F24J 2/10* (2006.01)
  *F24J 2/46* (2006.01)
  *C23C 14/02* (2006.01)
  *C23C 14/08* (2006.01)
  *C23C 14/10* (2006.01)
(52) U.S. Cl.
  CPC .............. *C23C 14/081* (2013.01); *C23C 14/10* (2013.01); *F24J 2/1057* (2013.01); *F24J 2/14* (2013.01); *F24J 2/4607* (2013.01); *G02B 7/183* (2013.01); *F24J 2/4652* (2013.01); *F24J 2002/1071* (2013.01); *Y02E 10/45* (2013.01)

(56) References Cited

U.S. PATENT DOCUMENTS

2014/0041708 A1\* 2/2014 Wang .................. H01L 31/0547
  136/246

FOREIGN PATENT DOCUMENTS

| JP | 62-131611 | 6/1987 |
| JP | 2007-291476 | 11/2007 |
| JP | 2009-025716 | 2/2009 |
| WO | 00/44510 | 8/2000 |

\* cited by examiner

SOLAR LIGHT REFLECTING PLATE AND LIGHT COLLECTING/HEAT COLLECTING DEVICE

TECHNICAL FIELD

This disclosure relates to a solar light reflecting plate and a light condensing and heat collecting device, which are suitably used for solar thermal power generation.

BACKGROUND

As a light condensing and heat collecting device used for solar thermal power generation, a device including a solar light reflecting plate that condenses solar light and a heat collecting tube that is disposed at the focal point of the solar light reflecting plate is known.

As the solar light reflecting plate (reflecting mirror) provided in the light condensing and heat collecting device, for example, JP 57-4003 A discloses a solar light reflecting plate including a substrate 4 formed of an appropriate material, for example, metal and alloy such as aluminium, steel plate and stainless steel, or plastic, or the like, a metallic reflective film 5 formed of aluminium, silver, or the like and deposited on the substrate 4, and a transparent inorganic protective film 6 formed of a vitreous film such as SiO and $SiO_2$ and deposited on the surface of the metallic reflective film 5 (refer to the upper-right column of page 2).

As disclosed in JP 57-4003 A, in a case where the solar light reflecting plate (reflecting mirror) is provided with a reflective film, a diffuse reflectance is improved, but a regular reflectance that is important in solar thermal power generation is lowered.

We found that the regular reflectance is improved by reducing the surface roughness of the outermost surface (the surface of the reflective film) of the solar light reflecting plate.

However, it became clear that a high regular reflectance does not necessarily secure a high light condensing property and an improved power generation efficiency.

Thus, it could be helpful to provide a solar light reflecting plate and a light condensing and heat collecting device capable of obtaining an excellent light condensing property.

SUMMARY

We further found that in a case where a solar light reflecting plate having predetermined surface roughness is disposed in a specific direction with respect to a heat collecting tube, an excellent light condensing property may be obtained.

We thus provide:

(1) A solar light reflecting plate used for a light condensing and heat collecting device which includes a solar light reflecting plate that reflects and condenses solar light and a heat collecting tube that receives the solar light condensed by the solar light reflecting plate and is heated by the condensed solar light, wherein the solar light reflecting plate comprises at least a rolled substrate, wherein a surface roughness of a solar light reflecting surface that is an outermost surface and that reflects solar light is within a range of 0.02 μm to 1.0 μm in terms of arithmetic mean roughness Ra, and wherein the solar light reflecting plate is disposed so that an angle between a rolling direction of the substrate and a longitudinal direction of the heat collecting tube is within a range of 80° to 100°.

(2) The solar light reflecting plate according to (1) above, further comprising a metal-containing reflective film provided on the substrate.

(3) The solar light reflecting plate according to (2) above, further comprising a protective film provided on the reflective film.

(4) The solar light reflecting plate according to any one of (1) to (3) above, wherein the substrate is either a stainless steel plate or a cold-rolled steel plate.

(5) A light condensing and heat collecting device including a solar light reflecting plate that reflects and condenses solar light and a heat collecting tube that receives the solar light condensed by the solar light reflecting plate and is heated by the condensed solar light, wherein the solar light reflecting plate comprises at least a rolled substrate, wherein in the solar light reflecting plate, surface roughness of a solar light reflecting surface that is an outermost surface and that reflects the solar light is within a range of 0.02 μm to 1.0 μm in terms of arithmetic mean roughness Ra, and wherein the solar light reflecting plate is disposed so that an angle between a rolling direction of the substrate and a longitudinal direction of the heat collecting tube is within a range of 80° to 100°.

A solar light reflecting plate and a light condensing and heat collecting device capable of obtaining an excellent light condensing property, may be provided.

DESCRIPTION OF SYMBOLS

Figure 1:
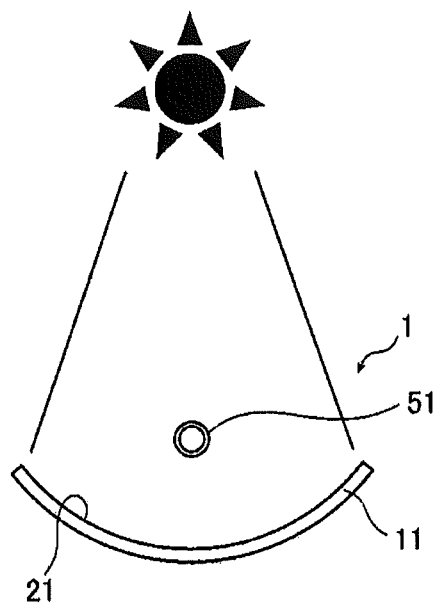
FIG. 1 is a cross-sectional view that schematically illustrates a light condensing and heat collecting device 1.

1: light condensing and heat collecting device
11: solar light reflecting plate
12: substrate
13: reflective film
14: protective film
21: solar light reflecting surface
22: rolling lines
51: heat collecting tube
D: detector
L: laser beam
P: laser pointer
S: slit

DETAILED DESCRIPTION

Hereinafter, examples of a light condensing and heat collecting device and a solar light reflecting plate of the invention will be described with reference to FIGS. 1 to 7(B).

Light Condensing and Heat Collecting Device

Figure 2:
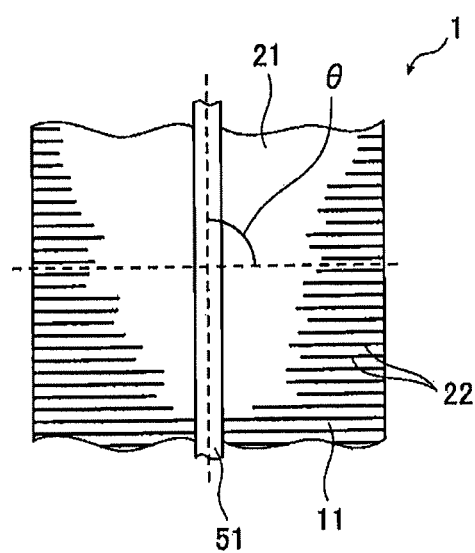
FIG. 2 is a plan view that schematically illustrates the light condensing and heat collecting device 1.

FIG. 1 shows a cross-sectional view that schematically illustrates a light condensing and heat collecting device 1, and FIG. 2 shows a plan view thereof. The light condensing and heat collecting device 1 includes at least a solar light reflecting plate 11 that reflects and condenses solar light, and a heat collecting tube 51 that receives the solar light condensed by the solar light reflecting plate 11 and is heated by the condensed solar light. The solar light reflecting plate 11 is bent to a predetermined curvature radius and condenses the solar light that enters in parallel with an optical axis on a focal point. The heat collecting tube 51 is disposed at this focal point.

In a case where the light condensing and heat collecting device 1 is used for solar thermal power generation, a thermal medium (not shown) such as oil flows inside the heat collecting tube 51 and the thermal medium is circulated by a pump (not shown). The heat collecting tube 51 is heated by solar light reflected by the solar light reflecting plate 11 to heat the thermal medium flowing through the heat collecting tube 51, the heated thermal medium is sent to a steam turbine (not shown) to change water into steam, and the steam turbine is rotated by the steam to generate electricity.

Heat Collecting Tube

The heat collecting tube 51 is a hollow member that is elongated in a straight line, and a conventional hollow tube may be used as the heat collecting tube 51 as long as the thermal medium may flow through the inside of the hollow tube. The heat collecting tube 51 may have a double-wall structure the inside of which is evacuated to give a thermal insulation property. In addition, an outer surface of the heat collecting tube 51 may be coated with a selective absorption film having a high solar light absorption rate and a low thermal radiation rate. As a material of the heat collecting tube 51, for example, copper, aluminum, iron, glass, or the like may be appropriately used.

Solar Light Reflecting Plate

The solar light reflecting plate 11 includes a rolled substrate 12 (refer to FIGS. 3 to 5) as a main component, and a plurality of rolling lines 22 formed along a rolling direction, are shown on the outermost surface (solar light reflecting surface 21) that reflects the solar light. The rolling lines 22 are formed during a rolling process.

Figure 3:
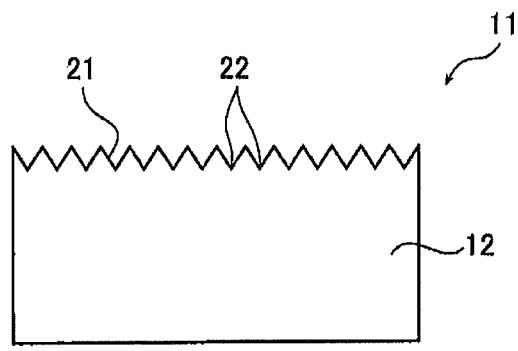
FIG. 3 is an enlarged cross-sectional view that illustrates an example of a solar light reflecting plate 11.
Figure 4:
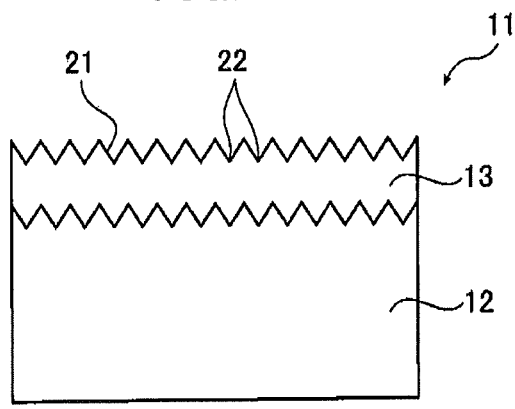
FIG. 4 is an enlarged cross-sectional view that illustrates another example of the solar light reflecting plate 11.
Figure 5:
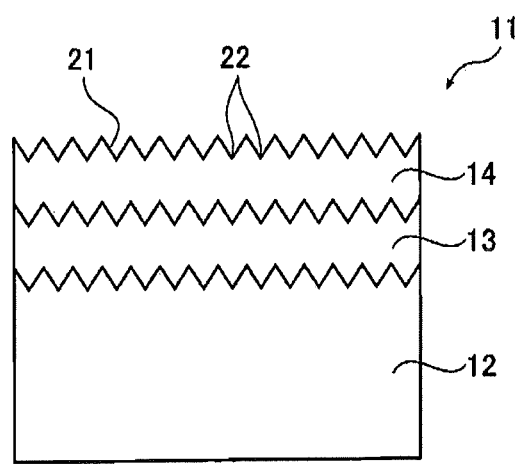
FIG. 5 is an enlarged cross-sectional view that illustrates still another example of the solar light reflecting plate 11.

FIG. 3 shows an enlarged cross-sectional view that illustrates an example of the solar light reflecting plate 11, FIG. 4 shows an enlarged cross-sectional view that illustrates another example of the solar light reflecting plate 11, and FIG. 5 shows an enlarged cross-sectional view that illustrates still another example of the solar light reflecting plate 11.

As shown in FIG. 3, the solar light reflecting plate 11 may include only the substrate 12, but as shown in FIG. 4, a reflective film 13 may be formed on the substrate 12. In addition, as shown in FIG. 5, a protective film 14 may be further formed on the reflective film 13. The materials of the substrate 12, the reflective film 13 and the protective film 14 and the like will be described later in detail.

In a case where the solar light reflecting plate 11 includes only the substrate 12 (refer to FIG. 3), a surface of the substrate 12 functions as the solar light reflecting surface 21, and the same rolling lines 22 as formed on the substrate 12 appear on the solar light reflecting surface 21.

In contrast with the above, in a case where the solar light reflecting plate 11 includes the substrate 12 and the reflective film 13 (refer to FIG. 4), a surface of the reflective film 13, which is the outermost surface of the solar light reflecting plate 11, functions as the solar light reflecting surface 21. In this configuration, the reflective film 13 is formed with the same uneven surface shape as the substrate 12. Therefore, the rolling lines 22 are also shown on the solar light reflecting surface 21 that is the surface of the reflective film 13.

A case where the protective film 14 is formed on the reflective film 13 (refer to FIG. 5) is also similar to the above. In this case, the surface of the protective film 14, which is the outermost surface of the solar light reflecting plate 11, functions as the solar light reflecting surface 21. In this configuration, the protective film 14 is formed with the same uneven surface shape as the substrate 12 and the reflective film 13. Therefore, the rolling lines 22 also appear on the solar light reflecting surface 21 that is the surface of the protective film 14.

Surface Roughness

In the solar light reflecting plate 11, the surface roughness of the solar light reflecting surface 21 that is the outermost surface of the solar light reflecting plate 11 and on which the rolling lines 22 are shown is within a range of 0.02 μm to 1.0 μm in terms of arithmetic mean roughness Ra.

Here, the surface roughness (arithmetic mean roughness Ra) is a value measured with respect to the direction (C direction) perpendicular to the rolling direction of the substrate 12 in accordance with JIS B0601: 2001.

As described above, in a case where the reflective film 13 is formed on the substrate 12 (refer to FIG. 4 or 5), the regular reflectance becomes low, but we found that the regular reflectance is improved by reducing the surface roughness of the solar light reflecting surface 21.

However we found that although a high regular reflectance is obtained by reducing the surface roughness of the solar light reflecting surface 21, the light condensing property of condensing light to the heat collecting tube 51 is not necessarily improved. That is, it became clear that a decrease in the surface roughness of the solar light reflecting surface 21 does not always result in an increased light condensing property.

We also unexpectedly found that the light condensing property to the heat collecting tube 51 is greatly improved when the solar light reflecting surface 21 is relatively rough, with an arithmetic mean roughness Ra of 0.02 μm to 1.0 μm.

The reason why the light condensing property is improved is not clear, but we believe it is as follows. In a case where the solar light reflecting surface 21 is made to have a low roughness through mirror finishing or the like, it is believed that the reflectance thereof in a planar state is satisfactory, but when the solar light reflecting plate 11 is bent as shown in FIG. 1, the optical axis tends to deviate due to the effect such as polishing distortion.

However, in a case where the surface roughness of the solar light reflecting surface 21 is within the above-described range, since the distortion is not likely to occur in the solar light reflecting plate 11 made to bend, and the solar light reflecting plate 11 has an ideal shape with respect to the heat collecting tube 51, the optical axis is not likely to deviate and thus, an excellent light condensing property is obtained.

By reason that more excellent light condensing property is obtained, it is preferable that the surface roughness of the solar light reflecting surface 21 be 0.04 μm to 0.50 μm in terms of the arithmetic mean roughness Ra, and more preferably 0.10 μm to 0.50 μm.

Furthermore, the more the surface roughness is reduced, the thinner the rolling lines 22 become to such an extent that it is difficult to visually recognize the rolling lines 22. However, even a case where the rolling lines 22 are not visually recognized is also included.

Angle between Solar Light Reflecting Plate and Heat Collecting Tube

As shown in FIG. 2, in the light condensing and heat collecting device 1, the solar light reflecting plate 11 and the heat collecting tube 51 are disposed in such a direction that an angle (indicated by θ in FIG. 2) between the rolling direction of the solar light reflecting plate 11 (imaginary line parallel with the rolling lines 22) and a longitudinal direction of the heat collecting tube 51 (imaginary line passing through the center of the heat collecting tube 51) is 80° to 100° (90°±10°).

Incidentally, in a plane on which rolling lines having an arithmetic mean roughness Ra that is on a level with wavelength of light are formed, reflected light tends to spread in a direction perpendicular to the rolling direction.

Figure 6A:
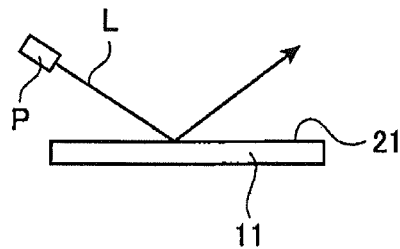
FIGS. 6(A) and 6(B) are schematic views illustrating a state where the solar light reflecting plate 11 formed in a planar shape is irradiated with light, in which (A) is a side view and (B) is a perspective view.
Figure 6B:
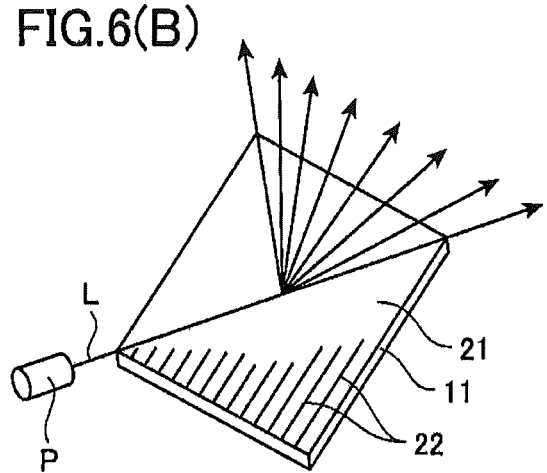

FIGS. 6(A) and 6(B) show schematic views illustrating a state where the solar light reflecting plate 11 formed in a planar shape is irradiated with light, in which (6) is a side view and (B) is a perspective view. In FIGS. 6(A) and 6(B), a visible light laser beam L (for example, a green laser beam having a wavelength of 532 nm, a red laser beam having a wavelength of 635 to 690 nm, or the like), which is irradiated from a laser pointer P in a direction parallel with the rolling direction, obliquely enters the solar light reflecting surface 21.

Referring to FIG. 6(A), it seems as if the visible laser beam L is regularly reflected, but referring to FIG. 6(B), it is possible to confirm a state where the visible laser beam L spreads in a direction perpendicular to the rolling direction. This light spreading occurs in one dimension, and an aspect ratio thereof is approximately 3 to 80.

Therefore, this one dimensional light spreading and the longitudinal direction of the heat collecting tube 51 are made to coincide with each other. That is, by setting the angle between the rolling direction of the solar light reflecting plate 11 and the longitudinal direction of the heat collecting tube 51 to 80° to 100° (90°±10°), an excellent light condensing property is obtained.

By reason that more excellent light condensing property is obtained, it is preferable that the angle be 85° to 95°, and more preferably 88° to 92°.

Substrate

The substrate 12 is not particularly limited as long as the substrate 12 is rolled, and the material thereof may be exemplified by a steel, aluminum, and plastic plate. The steel plate is not particularly limited as long as the steel plate is a common steel plate, but from the viewpoints of resistance to light, resistance to weather, and economic efficiency, a cold-rolled steel plate or a stainless steel plate is preferable, and by reason of excellent corrosion resistance of a rear surface, the stainless steel plate is more preferable.

It is preferable that the substrate 12 such as a stainless steel plate have the rolling lines 22 along the rolling direction and, more preferably, similarly to hairline finishing, the substrate 12 is polished in the rolling direction by appropriate abrasive grains or the like to have a linear shape.

As shown in FIG. 1, the solar light reflecting plate 11 is bent. From the viewpoint of making a bending process easy, it is preferable that the substrate 12 be thin. Specifically, it is preferable that the plate thickness of the substrate 12 be 0.5 mm or less, and more preferably 0.15 mm or less.

Reflective Film

The reflective film 13 is a film containing a metal, and as the metal, silver (Ag) or aluminum (Al) having high reflectance is appropriately used, and aluminum is preferable from an economic aspect.

It is preferable that the content of metal in the reflective film 13 be 50% by mass or more by reason of obtaining a satisfactory reflectance, more preferably 80% by mass or more, and still more preferably 90% by mass or more.

The method of depositing the reflective film 13 on the substrate 12 is not specifically limited and may be exemplified by a vapor deposition method such as a vacuum vapor deposition method and a plating method such as an electroplating method and a hot-dip coating method.

In the case of adopting the vapor deposition method, it is preferable that the thickness of the reflective film 13 be 0.5 μm or less from an aspect of uniformity, and more preferably 0.2 μm or less. On the other hand, in the case of adopting the plating method, the thickness of the reflective film 13 is set to approximately 5 μm to 50 μm.

Furthermore, in the case of adopting the vapor deposition method, it may be necessary to adjust the surface roughness of the substrate 12, and in the case of adopting the plating method, it may be necessary to adjust the surface roughness of the reflective film 13 through polishing or the like.

Particularly, in a case where the substrate 12 is an aluminum plate, the substrate 12 may be used as the solar light reflecting plate 11 without forming the reflective film 13 by performing polishing or the like on the surface of the substrate 12.

Protective Film

The protective film 14 is a conventional transparent protective film that provide resistance against outdoor corrosion, and examples thereof include a protective film containing a silicon oxide (SiO, $SiO_2$) as a main component, a protective film containing an aluminum oxide ($Al_2O_3$) as a main component, and the like. Here, the main component represents a component containing 60% by mass or more of the above-described component in terms of $SiO_2$ and/or $Al_2O_3$.

The method of forming the protective film 14 containing a silicon oxide as a main component may be exemplified by a method in which a silanol-based chemical agent, a silane coupling agent, or a silicone resin is applied on the reflective film 13, and then the applied material is cured by irradiation of ultraviolet rays or by heating.

The method of forming the protective film 14 containing an aluminum oxide as a main component may be exemplified by a method of depositing the protective film 14 on the reflective film 13 using a vapor deposition method such as a vacuum vapor deposition method.

There is no particular limitation on the thickness of the protective film 14, but it is preferable that the thickness be 10 μm or less from an aspect of a valance between a reflectance and a protective property, and more preferably 5 μm or less.

EXAMPLES

Our reflecting plates and collecting devices will be described in detail with reference to examples. However, this disclosure is not limited to these examples.

Examples 1 to 20 and Comparative Examples 1 to 19

As the substrate 12, the substrate shown in Table 1 was used, and the substrate was subjected to skin pass finishing and annealing. The reflective film 13 and the optional protective film 14 shown in Table 1 were formed to obtain a planar (before bending) solar light reflecting plate 11.

Reflective Film

The reflective film 13 that is an aluminum (Al) metal film was formed on a surface of the substrate 12 by generating metal vapor in accordance with the vacuum vapor deposition method.

Protective Film

The protective film 14 containing a silicon oxide ($SiO_2$) as a main component and the protective film 14 containing an aluminum oxide ($Al_2O_3$) as a main component were formed in accordance with the vacuum vapor deposition method.

Surface Roughness

With respect to the solar light reflecting surface 21 of the planar solar light reflective plate 11 that was obtained as described above, the arithmetic mean roughness Ra in a direction (C direction) perpendicular to the rolling direction of the substrate 12 was measured using a surface roughness measuring machine (Surftest SJ-400, manufactured by Mitutoyo Corporation) and in accordance with JIS B0601: 2001. Measurement results are shown in Table 1.

Regular Reflectance

With respect to the solar light reflecting surface 21 of the planar solar light reflective plate 11, the regular reflectance in a wavelength range of 300 nm to 2500 nm was measured using a spectrophotometer (UV-3100PC, manufactured by Shimadzu Corporation), and a mean value thereof was calculated as the regular reflectance. Results are shown in Table 1.

Light Condensing Rate

Figure 7A:
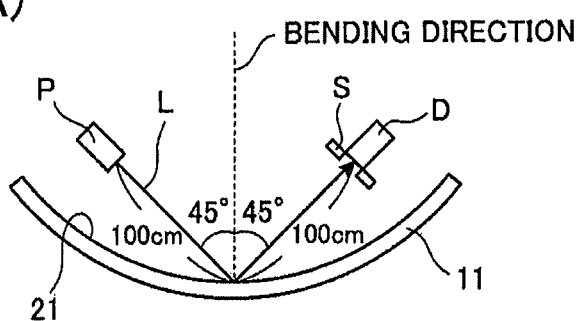
FIGS. 7(A) and 7(B) are schematic views illustrating an outline of a method of measuring a light condensing rate, in which (A) is a cross-sectional view and (B) is a plan view.
Figure 7B:
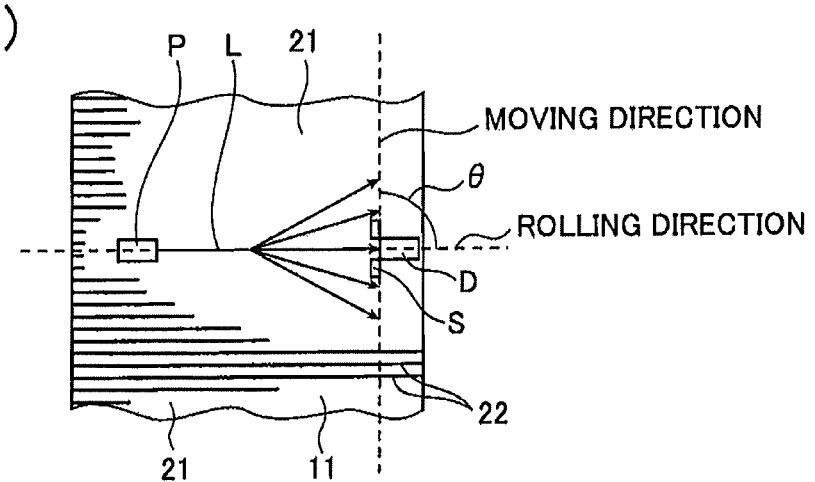

FIGS. 7(A) and 7(B) are schematic views illustrating an outline of a method of measuring a light condensing rate in which (A) is a cross-sectional view and (B) is a plan view.

First, the planar solar light reflecting plate 11 was bent in a curvature radius of 1 m.

Next, a red laser beam L (beam diameter: 5 mm), which is irradiated in parallel with the rolling direction from the laser pointer P, was made to enter the solar light reflecting surface 21 at an oblique angle of 45° with respect to a bending direction (indicated by a broken line in FIG. 7(A)) of the solar light reflecting plate 11, and light intensity at a position that corresponds to a regular reflection position was measured using a detector (light power meter 3664, manufactured by Hioki E.E. Corporation) D through a slit (diameter: 10 mm) S.

At this time, the intensity of the reflected light that was diffused in one dimension was measured while simultaneously moving the slit S and the detector D. The moving direction of the slit S and the detector D is a 90° direction with respect to the bending direction of the solar light reflecting plate 11, and an angle (indicated by θ in FIG. 7(B)) between the moving direction and the bending direction of the reflective plate 11 was appropriately changed. Furthermore, a moving range was set to ±20 cm with a regular reflection position made as a reference point.

The intensity measured in this way was integrated (integrated intensity), and a proportion of the integrated intensity with respect to the light intensity of the incident laser beam L was calculated as a light condensing rate (%) at a bent state. Results are shown in Table 1.

If a light condensing rate is 80% or more, the light condensing property may be evaluated as an excellent one.

TABLE 1-1

| | Substrate | | Reflective film | | Protective film | | Surface roughness [μm] | Regular reflectance [%] | Angle (θ) [°] | Light condensing rate [%] |
|---|---|---|---|---|---|---|---|---|---|---|
| | Kinds | Thickness [mm] | Component | Thickness [μm] | Main component | Thickness [μm] | | | | |
| Comparative Example 1 | Stainless steel plate | SUS430 | 0.05 | Al | 0.1 | — | — | 0.003 | 91 | 90.0 | 78 |
| Comparative Example 2 | Stainless steel plate | SUS430 | 0.05 | Al | 0.1 | — | — | 0.006 | 88 | 90.0 | 78 |
| Comparative Example 3 | Stainless steel plate | SUS430 | 0.05 | Al | 0.1 | — | — | 0.010 | 85 | 90.0 | 79 |
| Comparative Example 4 | Stainless steel plate | SUS430 | 0.05 | Al | 0.1 | — | — | 0.014 | 82 | 90.0 | 79 |
| Example 1 | Stainless steel plate | SUS430 | 0.05 | Al | 0.1 | — | — | 0.020 | 70 | 90.0 | 80 |
| Example 2 | Stainless steel plate | SUS430 | 0.05 | Al | 0.1 | — | — | 0.040 | 60 | 90.0 | 82 |
| Example 3 | Stainless steel plate | SUS430 | 0.05 | Al | 0.1 | — | — | 0.060 | 55 | 90.0 | 83 |
| Example 4 | Stainless steel plate | SUS430 | 0.05 | Al | 0.1 | — | — | 0.100 | 54 | 90.0 | 85 |
| Example 5 | Stainless steel plate | SUS430 | 0.05 | Al | 0.1 | — | — | 0.200 | 52 | 90.0 | 86 |
| Example 6 | Stainless steel plate | SUS430 | 0.05 | Al | 0.1 | — | — | 0.300 | 50 | 90.0 | 86 |
| Example 7 | Stainless steel plate | SUS430 | 0.05 | Al | 0.1 | — | — | 0.500 | 48 | 90.0 | 85 |
| Example 8 | Stainless steel plate | SUS430 | 0.05 | Al | 0.1 | — | — | 1.000 | 47 | 90.0 | 80 |
| Comparative Example 5 | Stainless steel plate | SUS430 | 0.05 | Al | 0.1 | — | — | 1.500 | 46 | 90.0 | 70 |
| Comparative Example 6 | Stainless steel plate | SUS430 | 0.05 | Al | 0.1 | — | — | 2.000 | 45 | 90.0 | 54 |
| Comparative Example 7 | Stainless steel plate | SUS430 | 0.05 | Al | 0.1 | — | — | 3.000 | 42 | 90.0 | 43 |
| Comparative Example 8 | Stainless steel plate | SUS430 | 0.05 | Al | 0.1 | — | — | 5.000 | 41 | 90.0 | 35 |
| Comparative Example 9 | Stainless steel plate | SUS430 | 0.05 | Al | 0.1 | — | — | 8.000 | 40 | 90.0 | 32 |

TABLE 1-2

| | Substrate | | Reflective film | | Protective film | | Surface roughness [μm] | Regular reflectance [%] | Angle (θ) [°] | Light condensing rate [%] |
|---|---|---|---|---|---|---|---|---|---|---|
| | Kinds | Thickness [mm] | Component | Thickness [μm] | Main component | Thickness [μm] | | | | |
| Comparative Example 10 | Stainless steel plate | SUS430 | 0.05 | Al | 0.1 | — | — | 0.200 | 52 | 0.0 | 35 |
| Comparative Example 11 | Stainless steel plate | SUS430 | 0.05 | Al | 0.1 | — | — | 0.200 | 52 | 30.0 | 41 |
| Comparative Example 12 | Stainless steel plate | SUS430 | 0.05 | Al | 0.1 | — | — | 0.200 | 52 | 50.0 | 50 |
| Comparative Example 13 | Stainless steel plate | SUS430 | 0.05 | Al | 0.1 | — | — | 0.200 | 52 | 70.0 | 63 |
| Comparative Example 14 | Stainless steel plate | SUS430 | 0.05 | Al | 0.1 | — | — | 0.200 | 52 | 75.0 | 71 |
| Example 9 | Stainless steel plate | SUS430 | 0.05 | Al | 0.1 | — | — | 0.200 | 52 | 80.0 | 80 |
| Example 10 | Stainless steel plate | SUS430 | 0.05 | Al | 0.1 | — | — | 0.200 | 52 | 85.0 | 82 |
| Example 11 | Stainless steel plate | SUS430 | 0.05 | Al | 0.1 | — | — | 0.200 | 52 | 90.0 | 85 |
| Example 12 | Stainless steel plate | SUS430 | 0.05 | Al | 0.1 | — | — | 0.200 | 52 | 95.0 | 82 |
| Example 13 | Stainless steel plate | SUS430 | 0.05 | Al | 0.1 | — | — | 0.200 | 52 | 100.0 | 80 |
| Comparative Example 15 | Stainless steel plate | SUS430 | 0.05 | Al | 0.1 | — | — | 0.200 | 52 | 105.0 | 70 |
| Comparative Example 16 | Stainless steel plate | SUS430 | 0.05 | Al | 0.1 | — | — | 0.200 | 52 | 110.0 | 64 |
| Comparative Example 17 | Stainless steel plate | SUS430 | 0.05 | Al | 0.1 | — | — | 0.200 | 52 | 130.0 | 49 |
| Comparative Example 18 | Stainless steel plate | SUS430 | 0.05 | Al | 0.1 | — | — | 0.200 | 52 | 150.0 | 40 |
| Comparative Example 19 | Stainless steel plate | SUS430 | 0.05 | Al | 0.1 | — | — | 0.200 | 52 | 180.0 | 34 |

TABLE 1-3

| | Substrate | | Reflective film | | Protective film | | Surface roughness [μm] | Regular reflectance [%] | Angle (θ) [°] | Light condensing rate [%] |
|---|---|---|---|---|---|---|---|---|---|---|
| | Kinds | Thickness [mm] | Component | Thickness [μm] | Main component | Thickness [μm] | | | | |
| Example 14 | Stainless steel plate | SUS430 | 0.05 | Al | 0.1 | $SiO_2$ | 0.2 | 0.190 | 52 | 90.0 | 88 |
| Example 15 | Stainless steel plate | SUS430 | 0.05 | Al | 0.1 | $SiO_2$ | 0.5 | 0.180 | 51 | 90.0 | 86 |
| Example 16 | Stainless steel plate | SUS430 | 0.05 | Al | 0.1 | $Al_2O_3$ | 0.5 | 0.200 | 50 | 90.0 | 87 |
| Example 17 | Cold-rolled steel plate | SPCC | 0.05 | Al | 0.1 | — | — | 0.200 | 52 | 90.0 | 87 |
| Example 18 | Cold-rolled steel plate | SPCC | 0.05 | Al | 0.1 | $SiO_2$ | 0.5 | 0.150 | 48 | 90.0 | 85 |
| Example 19 | Aluminum plate | A1080 | 0.05 | Al | 0.1 | $SiO_2$ | 0.5 | 0.150 | 48 | 90.0 | 85 |
| Example 20 | Plastic plate | Vinyl chloride | 0.05 | Al | 0.1 | $SiO_2$ | 0.5 | 0.150 | 48 | 90.0 | 85 |

As is clear from the results shown in Table 1, in the solar light reflecting plates of Examples 1 to 20, it was observed that the light condensing rate at a bent state was high and the light condensing property was excellent.

More specifically, for example, referring to Table 1-1, in Examples 1 to 8 in which the surface roughness (arithmetic mean roughness Ra) was within our range (0.02 μm to 1.0 μm), it was observed that the light condensing rate was 80% or more and thus the light condensing property was excellent. Conversely, in Comparative Examples 1 to 4 in which the surface roughness was less than our lower limit, and in Comparative Examples 5 to 9 in which the surface roughness exceeded our upper limit, it was observed that the light condensing rate was less than 80% and the light condensing property was inferior.

Also, referring to Table 1-2, in Examples 9 to 13 in which the angle θ was within our range (80° to 100°), it was observed that the light condensing rate was 80% or more and the light condensing property was excellent. Conversely, in Comparative Examples 10 to 14 in which the angle θ was less than our lower limit, and in Comparative Examples 15 to 19 in which the angle θ exceeded our upper limit, it was observed that the light condensing rate was less than 80% and the light condensing property was inferior.

Furthermore, referring to Table 1-3, it was observed that even in the case of providing the protective film on the reflective film or in the case of using a substrate other than the stainless steel plate, the light condensing rate was 80% or more and the light condensing property was excellent.

The invention claimed is:

1. A solar light reflecting plate having a bent to a predetermined curvature radius and condensing the solar light on a focal point used for a light condensing and heat collecting device which includes a solar light reflecting plate that reflects and condenses solar light and a heat collecting tube positioned on the focal point that receives the solar light condensed by the solar light reflecting plate and is heated by the condensed solar light, wherein
   (1) the solar light reflecting plate comprises at least a rolled substrate,
   (2) a surface roughness of a solar light reflecting surface that is an outermost surface and reflects solar light is from 0.02 μm to 1.0 μm range in terms of arithmetic mean roughness Ra, and
   (3) the solar light reflecting plate is disposed so that an angle between a rolling direction of the substrate and a longitudinal direction of the heat collecting tube is from 80° to 100° range.

2. The solar light reflecting plate according to claim 1, further comprising a metal-containing reflective film provided on the substrate.

3. The solar light reflecting plate according to claim 2, further comprising a protective film provided on the reflective film.

4. The solar light reflecting plate according to claim 1, wherein the substrate is either a stainless steel plate or a cold-rolled steel plate.

5. The solar light reflecting plate according to claim 1, wherein an excellent light condensing property to the heat collecting tube is obtained by setting the angle between the rolling direction of the solar light reflecting plate and the longitudinal direction of the heat collecting tube within a range of 80° to 100° when the solar light reflecting plate has an arithmetic mean roughness Ra of from 0.02 μm to 1.0 μm, such that the reflected light reflected by the solar light reflecting surface having rolling lines formed thereon can spread and be condensed in one dimension in a direction perpendicular to the rolling direction, the one dimensional light spreading and the longitudinal direction of the heat collecting tube being made to coincide with each other.

6. A light condensing and heat collecting device including a solar light reflecting plate having a bent to a predetermined curvature radius and reflecting and condensing solar light and a heat collecting tube positioned on the focal point that receives the solar light condensed by the solar light reflecting plate and is heated by the condensed solar light, wherein
   (1) the solar light reflecting plate comprises at least a rolled substrate,
   (2) in the solar light reflecting plate, surface roughness of a solar light reflecting surface that is an outermost surface and that reflects the solar light is from 0.02 μm to 1.0 μm range in terms of arithmetic mean roughness Ra, and
   (3) the solar light reflecting plate is disposed so that an angle between a rolling direction of the substrate and a longitudinal direction of the heat collecting tube is from 80° to 100° range.

7. The solar light reflecting plate according to claim 2, wherein the substrate is either a stainless steel plate or a cold-rolled steel plate.

8. The solar light reflecting plate according to claim 3, wherein the substrate is either a stainless steel plate or a cold-rolled steel plate.

9. The light condensing and heat collecting device according to claim 6, wherein an excellent light condensing property to the heat collecting tube is obtained by setting the angle between the rolling direction of the solar light reflecting plate and the longitudinal direction of the heat collecting tube within a range of 80° to 100° when the solar light reflecting plate has an arithmetic mean roughness Ra of from 0.02 μm to 1.0 μm, such that the reflected light, reflected by the solar light reflecting surface having rolling lines formed thereon can spread and be condensed in one dimension in a direction perpendicular to the rolling direction, the one dimensional light spreading and the longitudinal direction of the heat collecting tube being made to coincide with each other.

* * * * *